United States Patent
Zhang et al.

(10) Patent No.: US 9,048,866 B2
(45) Date of Patent: Jun. 2, 2015

(54) APPARATUS AND METHOD FOR CHECKING DECODED DATA, APPARATUS AND METHOD FOR DECODING, AND RECEIVING TERMINAL

(71) Applicant: Spreadtrum Communications (Tianjin) Co., Ltd., Tianjin (CN)

(72) Inventors: Zhenrui Zhang, Beijing (CN); Jun Zhang, Beijing (CN)

(73) Assignee: SPREADTRUM COMMUNICATIONS (TIANJIN) CO., LTD. (CN)

( * ) Notice: Subject to any disclaimer, the term of this patent is extended or adjusted under 35 U.S.C. 154(b) by 151 days.

(21) Appl. No.: 13/784,910

(22) Filed: Mar. 5, 2013

(65) Prior Publication Data

US 2014/0068398 A1 Mar. 6, 2014

(30) Foreign Application Priority Data

Aug. 31, 2012 (CN) .......................... 2012 1 0319840

(51) Int. Cl.
| | |
|---|---|
| G06F 11/10 | (2006.01) |
| H03M 13/00 | (2006.01) |
| H03M 13/09 | (2006.01) |
| H03M 13/27 | (2006.01) |
| H03M 13/29 | (2006.01) |
| H03M 13/39 | (2006.01) |

(52) U.S. Cl.
CPC ............ *H03M 13/09* (2013.01); *H03M 13/091* (2013.01); *H03M 13/2739* (2013.01); *H03M 13/2957* (2013.01); *H03M 13/3972* (2013.01); *H03M 13/6525* (2013.01)

(58) Field of Classification Search
CPC ... H04L 1/0061; G06F 11/10; G06F 11/1004; H03M 13/091
USPC .................. 714/781, 782, 783, 784, 785, 807
See application file for complete search history.

(56) References Cited

U.S. PATENT DOCUMENTS

2005/0053040 A1* 3/2005 Choi et al. ..................... 370/335
2008/0154998 A1* 6/2008 Ikeda ............................ 708/210

* cited by examiner

*Primary Examiner* — Albert Decady
*Assistant Examiner* — Kyle Vallecillo
(74) *Attorney, Agent, or Firm* — Cantor Colburn LLP (57) ABSTRACT

The present disclosure provides an apparatus and a method for checking decoded data, an apparatus and a method for decoding, and a receiving terminal. The apparatus for checking decoded data includes: an arithmetic unit to perform a check computation on decoded bits output from decoders in every clock cycle to obtain a computation result, where the check computation is performed by: denoting each decoded bit as a polynomial, computing the sum of the polynomials and performing polynomial modular arithmetic on the sum; and an output unit configured to output a check result, where the check result is the sum of the computation results in all the clock cycles during a decoding process. A real-time check computation of decoded data may be realized, so that power consumption may be saved.

20 Claims, 5 Drawing Sheets

APPARATUS AND METHOD FOR CHECKING DECODED DATA, APPARATUS AND METHOD FOR DECODING, AND RECEIVING TERMINAL

CROSS REFERENCE TO RELATED APPLICATIONS

The present application claims priority under 35 U.S.C. §119 to Chinese Application No. 201210319840.5, filed Aug. 31, 2012, the entire content of which is incorporated herein by reference.

FIELD OF THE DISCLOSURE

The present disclosure relates to communication technology, and more particularly, to an apparatus and a method for checking decoded data, an apparatus and a method for decoding and a receiving terminal.

BACKGROUND

Turbo-code is employed as one of the encoding schemes for the next-generation mobile communication systems and widely applied in communication field, as it has a decoding capability close to Shannon limit by using an iterative decoding method.

For example, a rate 1/3 Turbo-code is taken as a channel encoding scheme in the physical layer of the LTE (Long Term Evolution) standard. The Turbo-code employs two component encoders, input with a code block S appended with a checksum of CRC (Cyclic Redundancy Check), at a sending terminal. For the first component encoder, the input may be the code block S in the original order and the output may be a check sequence P0. For the second component encoder, the input may be the code block S interleaved by QPP (Quadratic Permutation Polynomial) and the output may be a check sequence P1. The sequences S, P0 and P1 may be sent to a transmission channel after rate matching and modulation.

Figure 1:
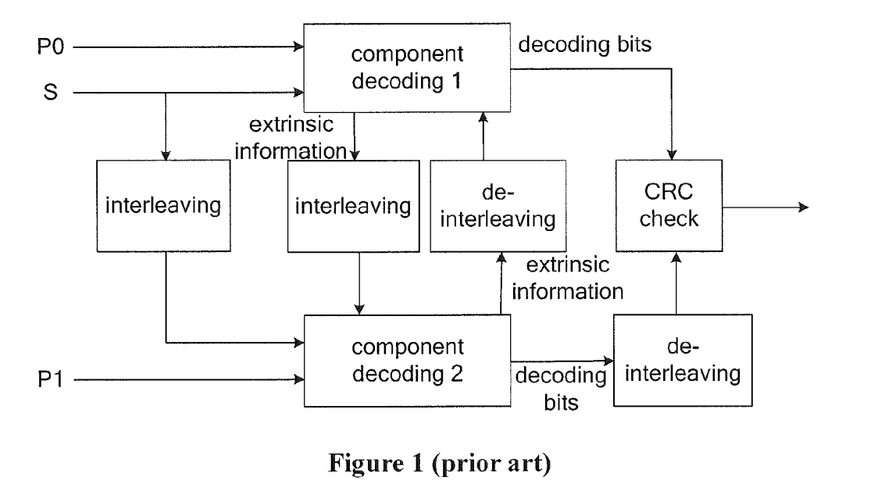
FIG. 1 schematically illustrates principles of a decoding process.

At a receiving terminal, Turbo-code may be decoded by employing iterative decoding. FIG. 1 schematically illustrates a decoding process of Turbo decoder. As shown in FIG. 1, the input of a component decoder 1 may be soft-information corresponding to S and P0, and extrinsic information output from a component decoder 2, where the extrinsic information is de-interleaved before sending to the component decoder 1. The output of the component decoder 1 may be extrinsic information to be sent to the component decoder 2 and decoded bits. Similarly, the input of the component decoder 2 may be soft-information corresponding to P1 and interleaved S, and extrinsic information output from the component decoder 1, where the extrinsic information is interleaved before sending to the component decoder 2. The output of the component decoder 2 may be extrinsic information to be sent to the component decoder 1 and decoded bits. The two component decoders may perform alternate and iterative decoding by interchanging extrinsic information, thereby improving the reliability of the decoded bits constantly. In the LTE standard, as each Turbo-code block has a checksum of CRC, CRC check may be performed on decoded bits output from each component decoder. If passing the CRC check, the Turbo-code decoding may be terminated in advance to save power consumption. Since the output of the component decoder 2 includes an interleaved sequence, de-interleaving need to be performed on the interleaved sequence before CRC check. During the decoding process, the two component decoders may not operate at the same time and computations thereof may be basically the same. Therefore, only one component decoder may be employed in practical hardware implementation to save chip area.

Since a conflict free QPP interleaver is employed in the LTE standard, a Turbo-code block may be divided into multiple data sections and each section may be decoded independently. Thus, multiple sections may be decoded in parallel, thereby improving throughput of the Turbo decoder.

Figure 2:
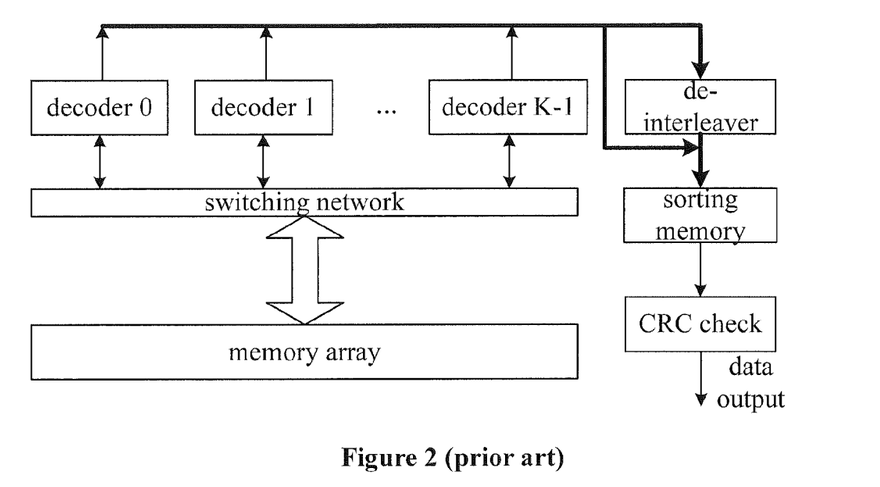
FIG. 2 schematically illustrates a structure of a conventional decoder.
Figure 3:
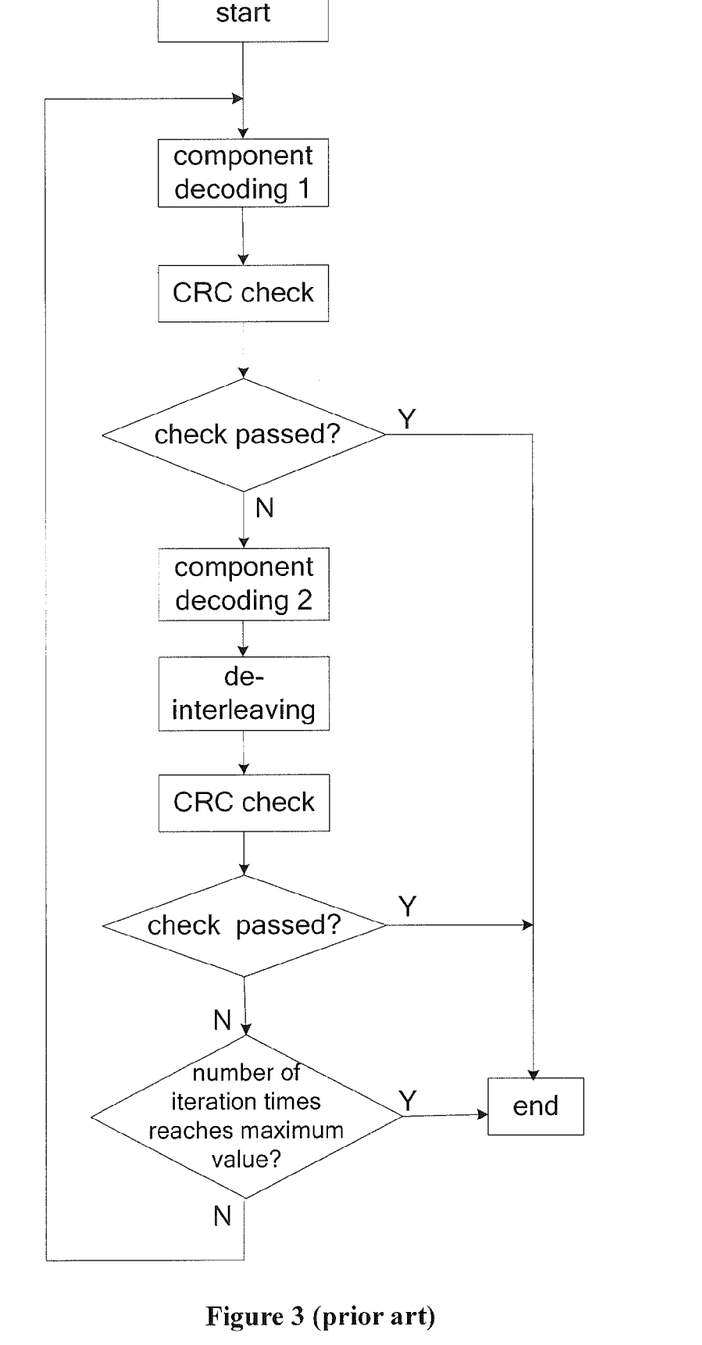
FIG. 3 schematically illustrates a flow chart of a conventional decoding.

FIG. 2 schematically illustrates a conventional Turbo decoder structure and FIG. 3 schematically illustrates a flow chart of a conventional method for decoding. Referring to FIG. 2 and FIG. 3, a Turbo-code block may be divided into K sections. K independent decoders may be employed to perform decoding in parallel, where the number K is generally called decoding parallelism. The K independent decoders read data from a memory array through a switching network, where the memory array includes K memory banks in which K sections are stored separately. The component decoders 1 and 2 may perform decoding alternately and iteratively. During the stage of outputting decoded bits of the component decoder 1, 2-bit data may be output from each of the K independent decoders in every clock cycle, so totally 2K-bit data for the K independent decoders. The 2K-bit data belongs to different K sections of the code block prior to being interleaved, so they need to be written to a sorting memory, in order to recover the code block's original order. Then the recovered data are read out from the sorting memory for CRC check. Similarly, during the stage of outputting decoded bits of the component decoder 2, 2-bit data may be output from each of the K independent decoders in every clock cycle, so totally 2K-bit data for the K independent decoders. The 2K-bit data belongs to different K sections of the interleaved code block, so they need to be de-interleaved and then written to a sorting memory, in order to recover the code block's original order. Then the recovered data are read out from the sorting memory for CRC check. If the decoded bits of the component decoder 1 or the component decoder 2 pass the CRC check or the number of iteration times reaches a maximum value, the decoding process may be terminated.

In conventional LTE Turbo decoders, the CRC check is performed on the data read from the sorting memory after component decoding, which may result in additional access to the sorting memory and extra decoding computations, which thereby decreases the throughput of the decoder and increases the hardware power consumption.

SUMMARY

The present disclosure provides a method to solve the problem that the hardware power consumption is high because CRC check is performed after component decoding in conventional approach.

Embodiments of the present disclosure provide an apparatus for checking decoded data, including:

an arithmetic unit configured to perform a check computation on decoded bits output from decoders in every clock cycle to obtain a computation result, where the check computation includes: denoting each decoded bit into a polynomial, computing a sum of the polynomials and performing polynomial modular arithmetic on the sum; and an output unit configured to output a check result, where the check result is a sum of the computation results in all the clock cycles during a decoding process.

Embodiments of the present disclosure further provide an apparatus for decoding, including:

a first component decoding unit and a second component decoding unit, where both the first component decoding unit and the second component decoding unit employ K decoders to decode, and the two component decoding units perform decoding processes alternately and iteratively; and a check control unit and the apparatus for checking decoded data as described above, where the check control unit is configured to control the apparatus for checking decoded data to perform check on the data output from the first component decoding unit or the second component decoding unit and output a check result.

Embodiments of the present disclosure further provide a receiving terminal including the above-described apparatus for decoding.

Embodiments of the present disclosure further provide a method for checking decoded data, including:

performing a check computation on decoded bits output from decoders in each clock cycle to obtain a computation result, where the check computation includes: denoting each decoded bit into a polynomial, computing a sum of the polynomials and performing polynomial modular arithmetic on the sum; and outputting a check result, where the check result is a sum of the computation results in all the clock cycles during the decoding process.

Optionally, the computation result may be obtained based on the following formula:

$$\tilde{c}(i) = c\left(\sum_{k=0}^{K-1}\left(m_{\frac{kL}{K}+I_a(i)}x^{L-\frac{kL}{K}-I_a(i)-1} + m_{\frac{kL}{K}+I_b(i)}x^{L-\frac{kL}{K}-I_b(i)-1}\right)\right)$$
$$= c\left(\sum_{k=0}^{K-1} m_{\frac{kL}{K}+I_a(i)}x^{L-\frac{kL}{K}-I_a(i)-1}\right) + c\left(\sum_{k=0}^{K-1} m_{\frac{kL}{K}+I_b(i)}x^{L-\frac{kL}{K}-I_b(i)-1}\right),$$

where $\tilde{c}(i)$ is the computation result, $$m_{\frac{kL}{K}+I_a(i)} \text{ and } m_{\frac{kL}{K}+I_b(i)}$$

are two one-bit data output from a decoder k in a clock cycle i, respectively, $$0 \le i < \frac{L}{2K},$$

0≤k<K, L is the length of a code block, K is the number of sections, $I_a(i)$ is an offset of the data $$m_{\frac{kL}{K}+I_a(i)}$$

in a section of the code block and $I_b(i)$ is an offset of the data $$m_{\frac{kL}{K}+I_b(i)}$$

in a section of the code block.

Optionally, the check computation includes:

invoking a basic unit to calculate $$c\left(x^{\frac{(K-k-1)L}{K}}\right)$$

for k=K−2 and invoking a multiplication unit to calculate $$c\left(x^{\frac{(K-k-1)L}{K}}\right)$$

for k≤K−3; and
invoking the basic unit to calculate $$c\left(x^{\frac{L}{K}-I_a(i)-1}\right) \text{ and } c\left(x^{\frac{L}{K}-I_b(i)-1}\right),$$

invoking a summation unit to calculate $s_a(i)$ and $s_b(i)$ invoking the multiplication unit to calculate $$\tilde{c}_a(i) = c\left(c\left(x^{\frac{L}{K}-I_a(i)-1}\right)S_a(i)\right) \text{ and }$$
$$\tilde{c}_b(i) = c\left(c\left(x^{\frac{L}{K}-I_b(i)-1}\right)S_b(i)\right),$$

and invoking an addition unit to calculate the computation result $\tilde{c}(i)=\tilde{c}_a(i)+\tilde{c}_b(i)$;

where the basic unit is configured to calculate $c(x^n)$, where $$0 < n \le \frac{L}{K},$$

L is the length of the code block, K is the number of sections; where the summation unit is configured to calculate $$S_a(i) = \sum_{k=0}^{K-1} m_{\frac{kL}{K}+I_a(i)}c\left(x^{\frac{(K-k-1)L}{K}}\right) \text{ and } S_b(i) = \sum_{k=0}^{K-1} m_{\frac{kL}{K}+I_b(i)}c\left(x^{\frac{(K-k-1)L}{K}}\right),$$

where $$m_{\frac{kL}{K}+I_a(i)} \text{ and } m_{\frac{kL}{K}+I_b(i)}$$

are two one-bit data output from the decoder k in the clock cycle i, respectively, $$0 \le i < \frac{L}{2K}, 0 \le k < K;$$

where the multiplication unit is configured to perform a modular multiplication operation on two polynomials; and
where the addition unit is configured to perform an addition operation on two polynomials.

Optionally, outputting the check result includes: invoking the addition unit to output the check result.

Optionally, the calculation of $c(x^n)$ includes:
obtaining $c(x^{pw})$ by looking up a table with p as an index, wherein n=pw+q, w is a power of 2, 0≤q<w; and
calculating $c(x^{pw} x^q)$.

Optionally, the method for checking decoded data further includes: reading the output decoded data from the decoder.

Optionally, the method for checking decoded data further includes: outputting a control signal for terminating decoding processes if passing the check according to the check result.

Embodiments of the present disclosure further provide a method for decoding, including:

performing a first component decoding and a second component decoding, where both the first component decoding and the second component decoding employ K decoders to decode, and the two component decoding operates alternately and iteratively; and performing check on data output by the first component decoding or the second component decoding to output a check result by adopting the above-described method for checking decoded data.

Optionally, the method for decoding further includes:

storing the data output by the first component decoding or the second component decoding, where the data are sorted; and reading and outputting the sorted data if passing the check according to the check result.

Optionally, the method for decoding further includes: reading and outputting sorted data if failing the check according to the check result and the number of iteration times reaches a maximum value.

Compared with the prior art, in the above described embodiments, each decoded bit output from a decoder in each clock cycle is converted into a polynomial, and a sum of the polynomials is computed and polynomial modular arithmetic is performed on the sum, thereby realizing a real-time computation in checking decoded data. Therefore, it's not necessary to wait for the component decoding to complete, and then to read the data from the sorting memory to perform check on the data. Since the data are read out from the sorting memory only after passing the check, hardware power consumption caused by multiple unnecessary accesses to the sorting memory is saved.

When one component decoding passes the check, a control signal may be generated to terminate the decoding processes of the other component decoding, which improves throughput of the decoder and saves hardware power consumption by avoiding invalid iterative computations of component decoding.

DETAILED DESCRIPTION OF THE DISCLOSURE

A conventional Turbo decoder may perform CRC check on a code block based on an original order of the code block only after decoded bits of the whole code clock are generated. Therefore, a CRC computation can not be performed online and in real time, leading to a waste on power consumption of the Turbo decoder.

Specifically, for any component decoding, decoded bits are written into a sorting memory and read out according to the original order of the code block. Thereafter, the CRC check is performed on the decoded bits. If the check is failed, the read access to the sorting memory performed this time is wasted.

Besides, to improve the throughput of the decoder, CRC check performed on decoded bits output from one component decoder and a decoding process of the other component decoder need to be operated in parallel. However, once the CRC check is passed, the decoding process of the other component decoder becomes unnecessary. The later the CRC check result comes out, the more power consumption of the Turbo decoder may be wasted.

If the conventional checking process for decoded data can be improved to enable an online and real time CRC computation, decoding processes and a CRC computation for a component decoding may be performed in parallel. Therefore, the power consumption of the conventional decoder may be reduced. In light of this, inventors of the present disclosure made a careful analysis of the CRC computation and determination, and a new apparatus for decoding are provided on the basis of the analysis results.

Specifically, a CRC computation process is a process of polynomial modular arithmetic in Galois field, in which A-bit information $m=m_0|m_1|\ldots|m_{A-1}$ inputted is taken as a polynomial:

$$m(x) = \sum_{j=0}^{A-1} m_j x^{A-j-1} \qquad (1)$$

Thereafter, calculating a CRC polynomial:

$$c(m(x)x^C)=m(x)x^C \bmod g(x) \qquad (2)$$

where mod is a modular arithmetic operator, a C-order polynomial $$g(x) = x^C + \sum_{j=1}^{C} g_j x^{C-j},$$

which is also called a CRC generated polynomial, the number of the order C and a coefficient $g_j$ may be set according to practical requirements in advance, C>0, $g_j$ is 0 or 1. c(f(x)) represents performing polynomial modular arithmetic on a polynomial f(x), that is to say, c(f(x))=f(x)mod g(x).

A piece of C-bit check information corresponding to the generated CRC polynomial $c(m(x)x^C)$ is added to the end of the information m to form a new bit sequence s with a length of L=A+C code words. The sequence s is represented in polynomial form:

$$s(x)=x^C m(x)+c(m(x)x^C) \qquad (3)$$

During the check, it's only necessary to verify:

$$c(s(x))=s(x) \bmod g(x)=0 \qquad (4)$$

Assuming that a code block with a L-bit length is divided into K sections and decoded by K decoders during a decoding process. When decoded bits are output, two one-bit data output from a decoder k in a clock cycle i (where $0 \leq k \leq K$, $$0 \leq i \leq \frac{L}{2K}$$

in two component decoding are $m_a(k,i)$ and $M_b(k,i)$, respectively. Since LTE Turbo-code adopts a conflict free QPP interleaver, K-bit data $m_a(k,i)$ output from the K decoders have a same offset $I_a(i)$ in code sections either in a stage of component decoding 1 or component decoding 2. An index of the K-bit data in the code block with an original order may be represented as $$\frac{kL}{K} + I_a(i).$$

Similarly, the K-bit data $m_b(k,i)$ output from the K decoders have a same offset $I_b(i)$ in code sections either in the stage of component decoding 1 or component decoding 2. An index of the K-bit data in the code block with an original order may be represented as $$\frac{kL}{K} + I_b(i).$$

$I_a(i)$ and $I_b(i)$, relative to properties of the QPP interleaver, are also addresses according to which the decoders access memory banks. $I_a(i)$ and $I_b(i)$ may be determined by conventional methods. For example, for an even-time component decoding (which is not interleaved, and is performed by the component decoding 1), $$I_a(i) = i, \; I_b(i) = \frac{L}{K} - i - 1;$$

for an odd-time component decoding (which is interleaved, and is performed by the component decoding 2), $$I_a(i) = (f_1^* i^2 + f_2^* i) \bmod \frac{L}{K}, \; I_b(i) = \left(f_1^*\left(\frac{L}{K} - i - 1\right)^2 + f_2^*\left(\frac{L}{K} - i - 1\right)\right) \bmod \frac{L}{K},$$

$f_1$ and $f_2$ are parameters of the QPP interleaver.

The 2K-bit data may have different contributions to the CRC check result in different clock cycles. According to the different contributions, the 2K-bit data can be represented as polynomials, respectively, a sum of the polynomials is computed and polynomial modular arithmetic is performed on the sum based on following equations.

$$\tilde{c}(i) = c\left(\sum_{k=0}^{K-1} \left(m_{\frac{kL}{K}+I_a(i)} x^{L-\frac{kL}{K}-I_a(i)-1} + m_{\frac{kL}{K}+I_b(i)} x^{L-\frac{kL}{K}-I_b(i)-1}\right)\right) \quad (5)$$

$$= c\left(\sum_{k=0}^{K-1} m_{\frac{kL}{K}+I_a(i)} x^{L-\frac{kL}{K}-I_a(i)-1}\right) + c\left(\sum_{k=0}^{K-1} m_{\frac{kL}{K}+I_b(i)} x^{L-\frac{kL}{K}-I_b(i)-1}\right)$$

furthermore, $$c\left(\sum_{k=0}^{K-1} \begin{pmatrix} m_{\frac{kL}{K}+I_a(i)} x^{L-\frac{kL}{K}-I_a(i)-1} + \\ m_{\frac{kL}{K}+I_b(i)} x^{L-\frac{kL}{K}-I_b(i)-1} \end{pmatrix}\right) = \quad (6)$$

$$c\begin{pmatrix} x^{\frac{L}{K}-I_a(i)-1} \sum_{k=0}^{K-1} m_{\frac{kL}{K}+I_a(i)} x^{\frac{(K-k-1)L}{K}} + \\ x^{\frac{L}{K}-I_b(i)-1} \sum_{k=0}^{K-1} m_{\frac{kL}{K}+I_b(i)} x^{\frac{(K-k-1)L}{K}} \end{pmatrix} =$$

$$c\begin{pmatrix} c\left(x^{\frac{L}{K}-I_a(i)-1}\right) \sum_{k=0}^{K-1} m_{\frac{kL}{K}+I_a(i)} c\left(x^{\frac{(K-k-1)L}{K}}\right) + \\ c\left(x^{\frac{L}{K}-I_b(i)-1}\right) \sum_{k=0}^{K-1} m_{\frac{kL}{K}+I_b(i)} c\left(x^{\frac{(K-k-1)L}{K}}\right) \end{pmatrix}$$

where calculations of $$c\left(x^{\frac{(K-k-1)L}{K}}\right), \; c\left(x^{\frac{L}{K}-I_a(i)-1}\right) \text{ and } c\left(x^{\frac{L}{K}-I_b(i)-1}\right)$$

would be described hereunder, $$m_{\frac{kL}{K}+I_a(i)} \text{ and } m_{\frac{kL}{K}+I_b(i)}$$

are two one-bit data output from the decoder k in the clock cycle i, $$m_{\frac{kL}{K}+I_a(i)} \text{ is } m_a(k,i), \; m_{\frac{kL}{K}+I_b(i)} \text{ is } m_b(k,i), \text{ where } m_{\frac{kL}{K}+I_a(i)}$$

and $m_{\frac{kL}{K}+I_b(i)}$ are participated in the calculation as selection signals.
Defining:

$$\tilde{c}_a(i) = c\left(\sum_{k=0}^{K-1} m_{\frac{kL}{K}+I_a(i)} x^{L-\frac{kL}{K}-I_a(i)-1}\right) \quad (7)$$

$$\tilde{c}_b(i) = c\left(\sum_{k=0}^{K-1} m_{\frac{kL}{K}+I_b(i)} x^{L-\frac{kL}{K}-I_b(i)-1}\right) \quad (8)$$

$$s_a(i) = \sum_{k=0}^{K-1} m_{\frac{kL}{K}+I_a(i)} c\left(x^{\frac{(K-k-1)L}{K}}\right) \quad (9)$$

$$s_b(i) = \sum_{k=0}^{K-1} m_{\frac{kL}{K}+I_b(i)} c\left(x^{\frac{(K-k-1)L}{K}}\right) \quad (10)$$

thus:

$$\tilde{c}_a(i) = c\left(c\left(x^{\frac{L}{K}-I_a(i)-1}\right) s_a(i)\right) \quad (11)$$

$$\tilde{c}_b(i) = c\left(c\left(x^{\frac{L}{K}-I_b(i)-1}\right) s_b(i)\right) \quad (12)$$

$$\tilde{c}(i) = \tilde{c}_a(i) + \tilde{c}_b(i) \quad (13)$$

$$c(s(x)) = \sum_{i=0}^{\frac{L}{2K}-1} \tilde{c}(i) \quad (14)$$

In light of the above, a real-time CRC computation method aiming at the output of the LTE Turbo decoding is provided, wherein the addition computations are all XOR operations on bits and the multiplication computations are all polynomial modular multiplication.

Hereinafter, calculations of $$c\left(x^{\frac{(K-k-1)L}{K}}\right), c\left(x^{\frac{L}{K}-l_a(i)-1}\right) \text{ and } c\left(x^{\frac{L}{K}-l_b(i)-1}\right)$$

will be described.

The computation result of $$c\left(x^{\frac{(K-k-1)L}{K}}\right)$$

only relates to the length L of the code block, the number K of sections and the section index k. During one time of Turbo decoding, L and K are fixed values and k may have K different values which are 0, 1, . . . , K−1. Thus, K different values of $$c\left(x^{\frac{(K-k-1)L}{K}}\right)$$

may be calculated at once at the initialization stage of the decoding.

If k=K−1, $c(x^0)$ is a constant.
If k=K−2, $$c\left(x^{\frac{L}{K}}\right)$$

is to be calculated. Generally, $c(x^n)$ can be calculated by the following three steps, where $$0 < n \le \frac{L}{K}:$$

Step S1, denoting n as pw+q, wherein w is a power of 2, and 0≤q<w. In practice, the value of w may be determined based on the largest section length designed for the decoder, so as to control the size of a look-up table in Step S2, wherein the length of sections is $$\frac{L}{K}.$$

For example, the largest length of Turbo-code blocks in LTE is 6144. If the largest decoding parallelism is 8, the largest length of sections is 6144/8=768, accordingly, w may be 16; if the largest decoding parallelism is 16, the largest length of sections is 6144/16=384, w may be 8. p is an integer part of n/w, and q equals to n mod w, namely, q is a remainder part of n/w.

Step S2, obtaining $c(x^{pw})$ by looking up a table with p as an index, where the table is a look-up table related to $c(x^{lw})$ built in advance according to the hardware design, where $$0 \le l \le \left\lfloor \frac{L}{Kw} \right\rfloor \cdot \left\lfloor \frac{L}{Kw} \right\rfloor$$

is a maximum integer not greater than $$\frac{L}{Kw}.$$

In the look-up table, $c(x^{lw})$ is obtained by a standard CRC computation, i.e., performing polynomial modular arithmetic on polynomial $x^{lw}$ based on $c(x^{lw})=x^{lw} \mod g(x)$.

Figure 4:
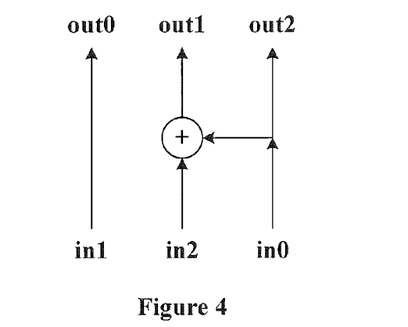
FIG. 4 schematically illustrates an embodiment for implementing combinational logic of c(f(x)x)

Step S3, calculating $c(x^{pw} x^q)$. Generally, a calculation c(f(x)x) may be implemented using simple combinational logic, where $f(x)=x^{pw}$. For example, FIG. 4 schematically illustrates an embodiment for implementing combinational logic of c(f(x)x) when a polynomial $g(x)=x^3+x+1$ is generated. If $c(f(x))=in0*x^2+in1*x+in2$, then $c(f(x)x)=out0*x^2+out1*x+out2$. Furthermore, since the value of q is limited in a range 0≤q<w, the calculation of $c(x^{pw} x^q)$ may be implemented with q-time iterations of c(f(x)x). This calculation is similar to shifting a polynomial to the left, adding q-bit of 0 on the right blank positions of the shifted polynomial to obtain a new polynomial, and recalculating a CRC polynomial of the new polynomial.

When k=K−3, $$c\left(x^{\frac{2L}{K}}\right)$$

may be calculated by calculating two $$c\left(x^{\frac{L}{K}}\right)$$

using polynomial modular multiplication, which may be represented as:

$$c\left(x^{\frac{2L}{K}}\right) = c\left(x^{\frac{L}{K}} x^{\frac{L}{K}}\right) = c\left(c\left(X^{\frac{L}{K}}\right)c\left(x^{\frac{L}{K}}\right)\right).$$

The polynomial modular multiplication will be described hereunder.

When k=K−4, $$c\left(x^{\frac{3L}{K}}\right)$$

may be calculated by calculating $$c\left(x^{\frac{L}{K}}\right) \text{ and } c\left(x^{\frac{2L}{K}}\right)$$

using polynomial modular multiplication, which may be represented as:

$$c\left(x^{\frac{3L}{K}}\right) = c\left(x^{\frac{2L}{K}} x^{\frac{L}{K}}\right)$$
$$= c\left(c\left(x^{\frac{2L}{K}}\right)c\left(x^{\frac{L}{K}}\right)\right).$$

When k=K−5, ..., 0, the calculation can be performed analogically.

Since $$0 \le \frac{L}{K} - I_a(i) - 1 < \frac{L}{K} \text{ and } 0 \le \frac{L}{K} - I_b(i) - 1 < \frac{L}{K},$$

calculations of $$c\left(x^{\frac{L}{K}-I_a(i)-1}\right) \text{ and } c\left(x^{\frac{L}{K}-I_b(i)-1}\right)$$

are similar to the calculation of $$c\left(x^{\frac{L}{K}}\right).$$

Hereafter, the polynomial modular multiplication operation will be described. The polynomial modular multiplication calculates a remainder of the product of two polynomials on the premise that remainders of the two polynomials are already known. Generally, assuming that the two polynomials are $f_1(x)$ and $f_2(x)$, thus:

$$c(f_1(x)f_2(x)) = c(c(f_1(x))c(f_2(x))) \quad (15)$$

Assuming $$c(f_2(x)) = \sum_{j=1}^{c} r_{2,j} x^{c-j} \quad (16)$$

thus $$c(c(f_1(x))c(f_2(x))) = c(f_1(x)f_2(x)) = \sum_{j=1}^{c} r_{2,j} c(x^{c-j} f_1(x)), \quad (17)$$

where the calculation of $c(x^{C-j}f_1(x))$ may refer to the calculation of $c(f(x)x^q)$, the calculation of $c(f_1(x)f_2(x))$ may be C modular addition operations of the polynomial, C is an order of the polynomial and $r_{2,j}$ is participated in the calculation as a selection signal.

Based on the above analysis, the conventional CRC computation is performed based on Formula (3), and thereby needs to be performed with the original order of the code block. However, in embodiments of the present disclosure, each bit output from the decoders in every clock cycle is represented as an individual polynomial, a sum of the polynomials is computed and polynomial modular arithmetic is performed on the sum, which is shown in Formula (5). Therefore, in every clock cycle during the output of the component decoding, the output of the decoders can be read out directly and the CRC computation can be performed thereon in real time. Furthermore, in a same clock cycle, the K decoders output two sets of K-bit data. As the two sets of K-bit data have the same offset in the code block sections, computational burden of real time CRC may be reduced by extracting a common factor, as shown in Formula (6).

Thus, embodiments of the present disclosure provide an apparatus for checking decoded data to perform CRC check on data output by Turbo component decoding. The apparatus for checking decoded data includes:

an arithmetic unit configured to perform a check computation on decoded bits output from decoders in every clock cycle to obtain a computation result, where the check computation includes: denoting each decoded bit into a polynomial, computing a sum of the polynomials and performing polynomial modular arithmetic on the sum; and an output unit configured to output a check result, where the check result is a sum of the computation results in all the clock cycles during a decoding process, i.e., $$c(s(x)) = \sum_{i=0}^{\frac{L}{2K}-1} \tilde{c}(i),$$

where $c(s(x))$ is the check result, $\tilde{c}(i)$ is the computation result in a clock cycle i.

Figure 5:
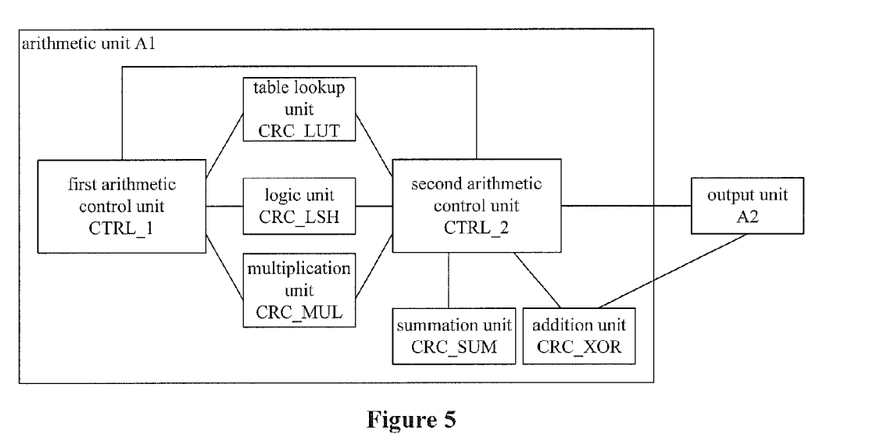
FIG. 5 schematically illustrates a structure of an apparatus for checking decoded data according to one embodiment of the present disclosure.

The arithmetic unit may directly obtain the computation result $\tilde{c}(i)$ based on the above-described Formula (5). However, the computational burden is large in this way. To reduce the computational burden of the real-time computation, the inventors did reduction and transformation based on Formula (5), shown in Formulas (6) to (14). Therefore, a preferable embodiments is provided, as shown in FIG. 5, the arithmetic unit A1 includes:

a table look-up unit CRC_LUT configured to obtain $c(x^{pw})$ by looking $$0 < n \le \frac{L}{K},$$

up a table with p as an index, where n=pw+q, w is a power of 2, 0≤q<w;

a logic unit CRC_LSH configured to calculate $c(x^{pw} x^q)$;

a summation unit CRC_SUM configured to calculate $$S_a(i) = \sum_{k=0}^{K-1} m_{\frac{kL}{K}+I_a(i)} c\left(x^{\frac{(K-k-1)L}{K}}\right) \text{ and } S_b(i) = \sum_{k=0}^{K-1} m_{\frac{kL}{K}+I_b(i)} c\left(x^{\frac{(K-k-1)L}{K}}\right),$$

wherein $$m_{\frac{kL}{K}+I_a(i)} \text{ and } m_{\frac{kL}{K}+I_b(i)}$$

are two one-bit data output from the decoder k in the clock cycle I, respectively, $$0 \le i < \frac{L}{2K}, 0 \le k < K;$$

a multiplication unit CRC_MUL configured to perform a modular multiplication operation on two polynomials;
an addition unit CRC_XOR configured to perform an addition operation on two polynomials.
a first arithmetic control unit CTRL_1 configured to invoke the table look-up unit CRC_LUT, the logic unit CRC_LSH and the multiplication unit CRC_MUL to calculate $$c\left(x^{\frac{(K-k-1)L}{K}}\right),$$

where k=0, 1, . . . , K−1; and
a second arithmetic control unit CTRL_2 configured to invoke the table look-up unit CRC_LUT and the logic unit CRC_LSH to calculate $$c\left(x^{\frac{L}{K}-l_a(i)-1}\right) \text{ and } c\left(x^{\frac{L}{K}-l_b(i)-1}\right),$$

invoke the summation unit CRC_SUM to calculate $s_a(i)$ and $s_b(i)$, invoke the multiplication unit CRC_MUL to calculate $$\tilde{c}_a(i) = c\left(c\left(x^{\frac{L}{K}-l_a(i)-1}\right)S_a(i)\right) \text{ and } \tilde{c}_b(i) = c\left(c\left(x^{\frac{L}{K}-l_b(i)-1}\right)S_b(i)\right)$$

and invoke the addition unit CRC_XOR to calculate $\tilde{c}(i)=\tilde{c}_a(i)+\tilde{c}_b(i)$.
In some embodiments, the output unit A2 is configured to call the addition unit CRC_XOR to calculate and output the check result $$c(s(x)) = \sum_{i=0}^{\frac{L}{2K}-1} \tilde{c}(i).$$

The above-mentioned computational resources may apply hardware structure. The table look-up unit CRC_LUT and the logic unit CRC_LSH perform the calculation of $c(x^n)$. The operation process of the table look-up unit CRC_LUT may refer to Step S1 and Step S2. The operation process of the logic unit CRC_LSH may refer to Step S3. The summation unit CRC_SUM implements the calculation of the above-mentioned Formulas (9) and (10). The multiplication unit CRC_MUL implements the calculation of Formula (17), where the input of the multiplication unit CRC_MUL is $c(f_1(x))$ and $c(f_2(x))$, and the output of the multiplication unit CRC_MUL is $c(c(f_1(x))c(f_2(x)))$, thereby implementing modular multiplication of two polynomials each of which has an order not greater than C−1. The addition unit CRC_XOR performs an addition operation on polynomials using an XOR operation on bits, where the input of the unit CRC_XOR is $c(f_1(x))$ and $c(f_2(x))$, and the output of the unit CRC_XOR is $c(f_1(x))+c(f_2(x))$.

Figure 6:
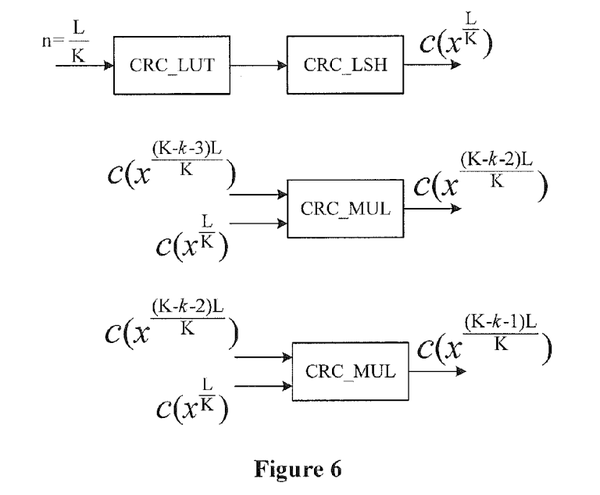
FIG. 6 schematically illustrates computational resources invoked by the first arithmetic control unit shown in FIG. 5 and an implementation process thereof.

In some embodiments, the CRC computation may be divided into two stages:
a first stage (initialization stage), where $$c\left(x^{\frac{(K-k-1)L}{K}}\right)$$

is calculated. Specifically, computational resources invoked by the first arithmetic control unit CTRL_1 and an implementation process thereof are illustrated in FIG. 6. The table look-up unit CRC_LUT and the logic unit CRC_LSH are invoked to calculate $$c\left(x^{\frac{(K-k-1)L}{K}}\right)$$

as k=K−2, i.e., to calculate $$c\left(x^{\frac{L}{K}}\right),$$

where $$n = \frac{L}{K};$$

the multiplication unit CRC_MUL is invoked to calculate $$c\left(x^{\frac{(K-k-1)L}{K}}\right)$$

when k=K−3, K−4, K−5, . . . , 0. Two multiplication units CRC_MUL need to be employed here, the input of one multiplication unit is $$c(f_1(x)) = c\left(x^{\frac{L}{K}}\right) \text{ and } c(f_2(x)) = c\left(x^{\frac{(K-k-3)L}{K}}\right),$$

and the input of the other multiplication unit is $$c(f_1(x)) = c\left(x^{\frac{L}{K}}\right) \text{ and } c(f_2(x)) = c\left(x^{\frac{(K-k-2)L}{K}}\right).$$

Figure 7:
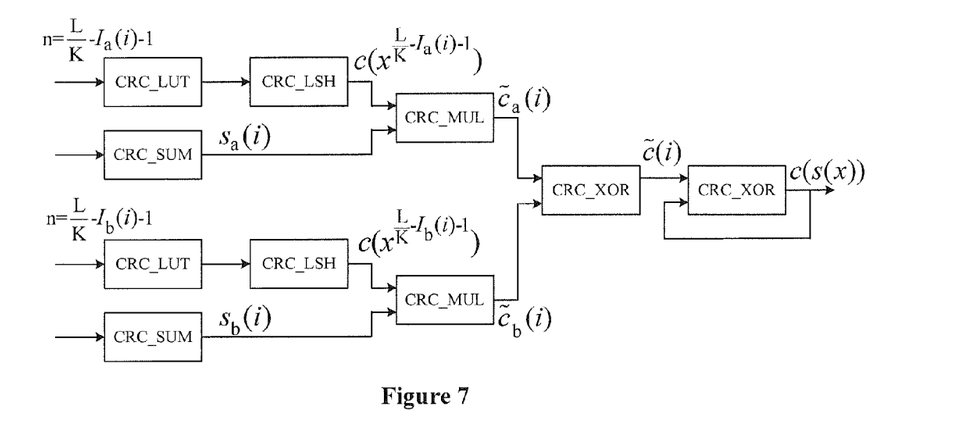
FIG. 7 schematically illustrates computational resources invoked by the second arithmetic control unit and the output unit shown in FIG. 5 and an implementation process thereof.

The first arithmetic control unit CTRL_1 may be implemented by a state machine, and $$c\left(x^{\frac{(K-k-1)L}{K}}\right)$$

is only calculated once at the initialization stage; and
a second stage (real-time computation stage), where the second arithmetic $$m_{\frac{kL}{K}+l_a(i)}$$

control unit CTRL_2 calculates $\tilde{c}(i)$ according to the data output from the decoder in every clock cycle and the offset $l_a(i)$ thereof, together with the data $$m_{\frac{kL}{K}+l_b(i)}$$

and the offsets $l_b(i)$ thereof; and the output unit A2 obtains $c(s(x))$ by the accumulating $\tilde{c}(i)$
Computational resources invoked by the second arithmetic control unit CTRL_2 and the output unit A2, and an implementation process thereof are illustrated in FIG. 7. Calculation of $\tilde{c}_a$ V) will be illustrated as an example. The second arithmetic control unit CTRL_2 invokes the table look-up unit CRC_LUT and the logic unit CRC_LSH to calculate $$c\left(x^{\frac{L}{K}-l_a(i)-1}\right),$$

where $$n = \frac{L}{K} - l_a(i) - 1.$$

The summation unit CRC_SUM is invoked to calculate $s_a(i)$ according to the data $$m_{\frac{kL}{K}+l_a(i)} \text{ and } c\left(x^{\frac{(K-k-1)L}{K}}\right)$$

calculated in the first stage. Then the multiplication unit CRC_MUL is invoked to calculate $\tilde{c}_a(i)$, where the input of the unit CRC_MUL is $$c(f_1(x)) = c\left(x^{\frac{L}{K}-l_a(i)-1}\right)$$

and $c(f_2(x))=s_a(i)$ (illustrated in a same way as that in Formula (16)).

$$c\left(x^{\frac{L}{K}-l_a(i)-1}\right)$$

and $s_a(i)$ can be calculated in parallel. Calculation of $\tilde{c}_b(i)$ is similar to that of $\tilde{c}_a(i)$.

The second arithmetic control unit CTRL_2 invokes the addition unit CRC_XOR based on the calculated $\tilde{c}_a(i)$ and $\tilde{c}_b(i)$ to calculate $\tilde{c}(i)$, where the input of the unit CRC_XOR is $c(f_1(x))=\tilde{c}_a(i)$ and $c(f_2(x))=\tilde{c}_b(i)$ The output unit A2 invokes the summation unit CRC_XOR to accumulate $\tilde{c}(i)$ in every clock cycle, where $$0 \le i < \frac{L}{2K},$$

so as to obtain $c(s(x))$. The input of the unit CRC_XOR is $c(f_1(x))=\tilde{c}(i)$ and $c(f_2(x))=\tilde{c}(i-1)$.

The hardware design for the calculation in the second stage is implemented in a real-time pipelining. Since no period overlaps between the calculation in the first stage and the calculation in the second stage, the hardware resources employed in the first stage calculation may also be employed in the second stage calculation. As a result, to implement the real-time CRC computation, there are required 2 for each kind of the main computational resources used, including CRC_LUT, CRC_LSH, In the computation process of the two stages described above, the extracted common factor $$c\left(x^{\frac{(K-k-1)L}{K}}\right)$$

is only calculated once during one decoding process. Besides, $$c\left(x^{\frac{L}{K}-l_a(i)-1}\right) \text{ and } c\left(x^{\frac{L}{K}-l_b(i)-1}\right)$$

are also calculated once in a clock cycle. Compared with the computation method based on Formula (5), the number of the multiplication units CRC_MUL used in the arithmetic unit can be reduced from 2K to 2, thereby effectively reducing the computational burden of the polynomial modular multiplication.

It should be noted, to reduce the computation complexity, $c(x^n)$ is obtained using a table lookup method in an embodiment. Namely, $c(x^n)$ is calculated using the table look-up unit and the logic unit. In other embodiments, $c(x^n)$ may be calculated directly by employing the basic unit based on $c(x^n)=x^n \mod g(x)$, when n is relatively small.

As the arithmetic unit realizes the real-time CRC computation, in every clock cycle during the process for outputting decoded data from the component decoding, the apparatus for checking decoded data of the present disclosure can read out the decoded data directly from the decoders using an access unit, rather than read out the decoded data from a sorting memory after the component decoding is finished. Specifically, the access unit reads out the decoded data from the K decoders in the clock cycle i.

Furthermore, in practical hardware implementation of a Turbo decoder, to reduce a back-to-back delay (the delay basically equals to the pipelining length for performing a CRC computation in an embodiment of the present disclosure) between the two component decoding, iteration of one component decoding can start without waiting for the completion of the CRC computation on the other component decoding. When the CRC computation is passed, a control signal is generated to perform a soft reset on the current operated iteration of the component decoding, i.e., the decoding process is terminated. Therefore, in an embodiment, the apparatus for checking decoded data further includes a decoding control unit which is configured to output a control signal for terminating the decoding after the check is determined to be passed according to the check result. That the check is passed means the check result is $c(s(x))=0$.

Figure 8:
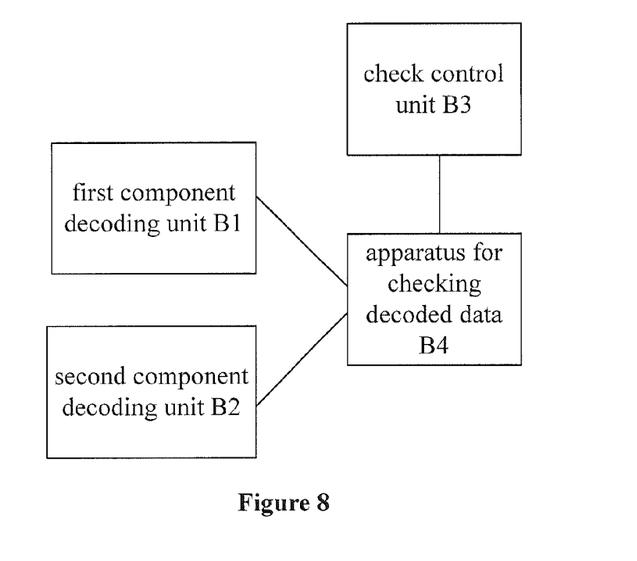
FIG. 8 schematically illustrates a structure of an decoding apparatus according to one embodiment of the present disclosure.

Based on the above apparatus for checking decoded data, embodiments in the present disclosure further provide an apparatus for decoding. As shown in FIG. 8, the apparatus for decoding includes: a first component decoding unit B1, a second component decoding unit B2, a check control unit B3 and an apparatus for checking decoded data B4. Both the first component decoding unit B1 and the second component decoding unit B2 employ K decoders to decode, respectively. And the two component decoding units perform decoding processes alternately and iteratively. The check control unit B3 is configured to control the apparatus for checking decoded data B4 to perform check on the data output from the first component decoding unit B1 or the second component decoding unit B2, and output a check result. The apparatus for checking decoded data B4 has been described in detail previously.

In some embodiments, the apparatus for decoding further includes: a sorting memory unit to store the data output from the first component decoding unit or the second component decoding unit, where the data are sorted; and a unit for outputting decoded data to read and output the sorted data from the sorting memory unit after the check is determined to be passed according to the check result.

Optionally, the unit for outputting decoded data is further configured to read and output the sorted data from the sorting memory unit when the check is determined to be failed according to the check result and the number of iteration times reaches a maximum value. In other embodiments, the decoded data may not be output when the check is determined to be failed according to the check result and the number of iteration times reaches the maximum value.

Besides, the two component decoding of the decoding process do not operate at the same time. Therefore, the first component decoding unit B1 and the second component decoding unit B2 can share the K decoders.

Figure 9:
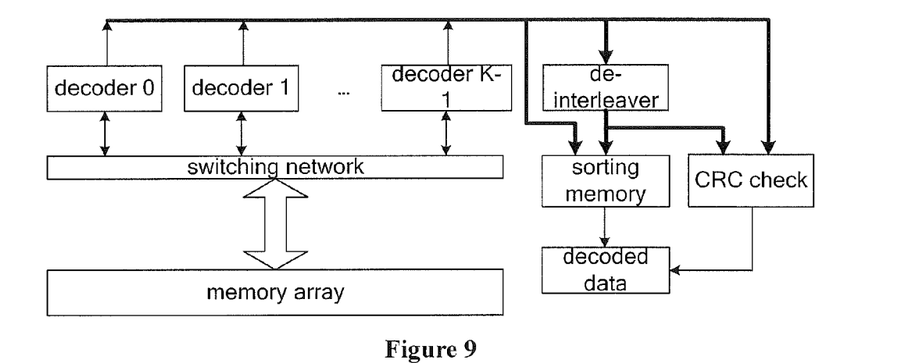
FIG. 9 schematically illustrates work processes of a decoding apparatus according to one embodiment of the present disclosure.

Hereinafter, a decoding and checking process of an apparatus for decoding according to one embodiment of the present disclosure will be illustrated with reference to FIG. 9.

Component decoding 1 and component decoding 2 are performed alternately and iteratively by K decoders, respectively. The K decoders read data from a memory array through a switching network. A first component decoding unit performs the component decoding 1 and a second component decoding unit performs the component decoding 2, where the second component decoding unit further includes a de-interleaver. During each of the component decoding processes, data output from each component decoding unit in every clock cycle are written into a sorting memory to be resorted and recovered to an original order of the code block.

During the stage of outputting decoded bits of the component decoding 1, two one-bit data are output from each decoder in every clock cycle, so 2K-bit data are output from the K decoders in every clock cycle. The 2K-bit data, belonging to K different sections of the pre-interleaved code block, can be transmitted to the apparatus for checking decoded data and given a real-time CRC computation by the arithmetic unit. That is to say, the decoding process and check computation of the component decoding 1 can be performed in parallel. After the decoding process of the component decoding 1 is finished, a sum of the CRC computation results in all the clock cycles of the component decoding 1, i.e., a check result of the component decoding 1, is output from the output unit.

During the stage of outputting decoded bits of the component decoding 2, two one-bit data are output from each decoder in every clock cycle, so 2K-bit data are output from the K decoders in every clock cycle. The 2K-bit data, belonging to K different sections of the interleaved code block, can be de-interleaved and then transmitted to the apparatus for checking decoded data and given a real-time CRC computation by the arithmetic unit. That is to say, the decoding process and check computation of the component decoding 2 can be performed in parallel. After the decoding process of the component decoding 2 is finished, a sum of the CRC computation results in all the clock cycles of the component decoding 2, i.e., a check result of the component decoding 2, is output from the output unit.

The component decoding 2 can start right after the component decoding 1 is finished, rather than after the check computation performed on the component decoding 1 is finished. When the decoding control unit determines that the component decoding 1 passes the check according to the check result, it outputs a control signal to terminate the decoding process of the component decoding 2.

Similarly, the component decoding 1 can start right after the component decoding 2 is finished, rather than after the check computation performed on the component decoding 2 is finished. When the decoding control unit determines that the component decoding 2 passes the check according to the check result, it outputs a control signal to terminate the decoding process of the component decoding 1.

When the decoding control unit determines the component decoding 1 or the component decoding 2 passes the check, the unit for outputting decoded data reads the sorted data from the sorting memory and outputs the sorted data.

In conclusion, embodiments of the present disclosure have the following advantages.

By denoting each decoded bit as a polynomial, computing the sum of the polynomials and performing the polynomial modular arithmetic on the sum, a real-time check computation of decoded data is realized. Therefore, there is no need to read the decoded data out from the sorting memory and check the decoded data after the decoding is finished. Since the decoded data are only read out from the sorting memory after the check is passed, hardware power consumption wasted due to multiple invalid accesses to the sorting memory may be saved.

The decoding and check computation of a component decoding can be performed in parallel. The check result can be generated earlier after the completion of the component decoding. Therefore, the processing speed for checking the decoded data may be improved. The decoding of a component decoding and the check computation of another component decoding can be performed in parallel, thereby increasing the processing speed for decoding.

The check result may come out in time after the decoding process of one component decoding is finished. When the check of the component decoding is passed, the decoding process of the other component decoding is terminated through a control signal. Therefore, throughput of the apparatus for decoding may increase and the hardware power consumption may decrease due to the avoidance of invalid iterative computations of the component decoding.

The two component decoding performs CRC check with the same logic, thereby simplifying the hardware design.

By using the features of a QPP interleaver, the bits output from the decoders in the same clock cycle may have the same section offset. The computation of the polynomial modular multiplication and the computation complexity of the real-time check may be reduced by extracting the common factor.

$c(x^{pw})$ is obtained by denoting n as pw+q and using a look-up table, which simplifies the computation. $c(x^{pw} x^q)$ is implemented with combinational logic, so that the depth of the look-up table may be reduced.

Decoded bits output from the K decoders in each clock cycle are divided into two sets according to the offsets of the bits in sections. The same hardware structure can be employed to obtain the devotion $\tilde{c}_a(i)$ and $\tilde{c}_b(i)$ which the two sets of bits bring to the total CRC check.

The CRC check computation is divided into two stages, the initialization stage and the real-time computation stage. And the basic computation is categorized into CRC_LUT, CRC_LSH, CRC_SUM and CRC_MUL. Since no period overlap exists between the two stages, the computational resources may be multiplexed to the maximum and the hardware design is simplified. There are required 2 for each kind of the main computational resources used, including CRC_LUT, CRC_LSH, CRC_SUM and CRC_MUL.

Although the present disclosure has been disclosed as above with reference to preferred embodiments thereof but will not be limited thereto. Those skilled in the art can modify and vary the embodiments without departing from the spirit and scope of the present disclosure. Accordingly, without departing from the scope of the present invented technology scheme, whatever simple modification and equivalent variation belong to the protection range of the present invented technology scheme.

What is claimed is:

1. An apparatus for checking decoded data, comprising:
   an arithmetic unit configured to perform a check computation on decoded bits output, in one clock cycle, from a plurality of decoders to obtain a computation result, where the decoded bits are divided into a plurality of code sections respectively corresponding to the plurality of decoders, and the code sections have the same offset configuration for the decoded bits contained therein, where the check computation comprises: denoting each decoded bit into a polynomial, computing a sum of the polynomials and performing polynomial modular arithmetic on the sum; and
   an output unit configured to output a check result, where the check result is a sum of the computation results in all the clock cycles during a decoding process.

2. The apparatus for checking decoded data according to claim 1, wherein the arithmetic unit obtains the computation result based on the following formula:

$$\tilde{c}(i) = c\left(\sum_{k=0}^{K-1} \left(m_{\frac{kL}{K}+l_a(i)} x^{L-\frac{kL}{K}-l_a(i)-1} + m_{\frac{kL}{K}+l_b(i)} x^{L-\frac{kL}{K}-l_b(i)-1}\right)\right)$$

$$= c\left(\sum_{k=0}^{K-1} m_{\frac{kL}{K}+l_a(i)} x^{L-\frac{kL}{K}-l_a(i)-1}\right) + c\left(\sum_{k=0}^{K-1} m_{\frac{kL}{K}+l_b(i)} x^{L-\frac{kL}{K}-l_b(i)-1}\right),$$

where $\tilde{c}(i)$ is the computation result, $m_{\frac{kL}{K}+l_a(i)}$ and $m_{\frac{kL}{K}+l_b(i)}$ are two one-bit data output from a decoder k in a clock cycle i, respectively $$0 \leq i < \frac{L}{2K},$$

$0 \leq k < K$, L is the length of a code block, K is the number of sections, $I_a(i)$ is an offset of the data $m_{\frac{kL}{K}+l_a(i)}$ in a section of the code block and $I_b(i)$ is an offset of the data $m_{\frac{kL}{K}+l_b(i)}$ in a section of the code block.

3. The apparatus for checking decoded data according to claim 1, wherein the arithmetic unit comprises:
   a basic unit configured to calculate $c(x^n)$, where $$0 < n \leq \frac{L}{K},$$

L is the length of the code block, K is the number of sections;
a summation unit configured to calculate $$S_a(i) = \sum_{k=0}^{K-1} m_{\frac{kL}{K}+l_a(i)} c\left(x^{\frac{(K-k-1)L}{K}}\right) \text{ and } S_b(i) = \sum_{k=0}^{K-1} m_{\frac{kL}{K}+l_b(i)} c\left(x^{\frac{(K-k-1)L}{K}}\right),$$

where $m_{\frac{kL}{K}+l_a(i)}$ and $m_{\frac{kL}{K}+l_b(i)}$ are two one-bit data output from a decoder k in a clock cycle i, $$0 \leq i < \frac{L}{2K}, 0 \leq k < K;$$

a multiplication unit configured to perform a modular multiplication operation on two polynomials;
an addition unit configured to perform an addition operation on two polynomials;
a first arithmetic control unit configured to invoke the basic unit to calculate $$c\left(x^{\frac{(K-k-1)L}{K}}\right)$$

when k=K−2 and invoke the multiplication unit to calculate $$c\left(x^{\frac{(K-k-1)L}{K}}\right)$$

when k≤K−3; and
a second arithmetic control unit to invoke the basic unit to calculate $$c\left(x^{\frac{L}{K}-l_a(i)-1}\right) \text{ and } c\left(x^{\frac{L}{K}-l_b(i)-1}\right),$$

invoke the summation unit to calculate $s_a(i)$ and $s_b(i)$, invoke the multiplication unit to calculate $$\tilde{c}_a(i) = c\left(c\left(x^{\frac{L}{K}-l_a(i)-1}\right)S_a(i)\right) \text{ and } \tilde{c}_b(i) = c\left(c\left(x^{\frac{L}{K}-l_b(i)-1}\right)S_b(i)\right),$$

and invoke the addition unit to calculate the computation result $\tilde{c}(i) = \tilde{c}_a(i) + \tilde{c}_b(i)$.

4. The apparatus for checking decoded data according to claim 3, wherein the output unit is configured to invoke the addition unit to output the check result.

5. The apparatus for checking decoded data according to claim 3, wherein the basic unit comprises:
   a table look-up unit configured to obtain $c(x^{pw})$ by looking up a table with p as an index, where n=pw+q, w is a power of 2, and $0 \leq q < w$; and
   a logic unit configured to calculate $c(x^{pw} c^q)$.

6. The apparatus for checking decoded data according to claim 1, further comprising an access unit to read the data output from decoders.

7. The apparatus for checking decoded data according to claim 1, further comprising a decoding control unit configured to output a control signal to terminate decoding after the check is determined to be passed according to the check result.

8. An apparatus for decoding, comprising:
   a first component decoding unit and a second component decoding unit, where both the first component decoding unit and the second component decoding unit employ K decoders to decode, and the two component decoding units perform decoding processes alternately and iteratively;
   an apparatus for checking decoded data, comprising:
      an arithmetic unit configured to perform a check computation on decoded bits output, in one clock cycle, from a plurality of decoders to obtain a computation result, where the decoded bits are divided into a plurality of code sections respectively corresponding to the plurality of decoders, and the code sections have the same offset configuration for the decoded bits contained therein, where the check computation comprises: denoting each decoded bit into a polynomial, computing a sum of the polynomials and performing polynomial modular arithmetic on the sum; and
      an output unit configured to output a check result, where the check result is a sum of the computation results in all the clock cycles during a decoding process; and
   a check control unit configured to control the apparatus for checking decoded data to perform check on data output from the first component decoding unit or the second component decoding unit and output a check result.

9. The apparatus for decoding according to claim 8, wherein the arithmetic unit obtains the computation result based on the following formula:

$$\tilde{c}(i) = c\left(\sum_{k=0}^{K-1} \left(m_{\frac{kL}{K}+I_a(i)} x^{L-\frac{kL}{K}-I_a(i)-1} + m_{\frac{kL}{K}+I_b(i)} x^{L-\frac{kL}{K}-I_b(i)-1}\right)\right)$$
$$= c\left(\sum_{k=0}^{K-1} m_{\frac{kL}{K}+I_a(i)} x^{L-\frac{kL}{K}-I_a(i)-1}\right) + c\left(\sum_{k=0}^{K-1} m_{\frac{kL}{K}+I_b(i)} x^{L-\frac{kL}{K}-I_b(i)-1}\right),$$

where $\tilde{c}(i)$ is the computation result, $$m_{\frac{kL}{K}+I_a(i)} \text{ and } m_{\frac{kL}{K}+I_b(i)}$$

are two one-bit data output from a decoder k in a clock cycle i, respectively, $$0 \leq i < \frac{L}{2K},$$

$0 \leq k < K$, L is the length of a code block, K is the number of sections, $I_a(i)$ is an offset of the data $$m_{\frac{kL}{K}+I_a(i)}$$

in a section of the code block and $I_b(i)$ is an offset of the data $$m_{\frac{kL}{K}+I_b(i)}$$

in a section of the code block.

10. The apparatus for decoding according to claim 8, wherein the arithmetic unit comprises:
   a basic unit configured to calculate $c(x^n)$, where $$0 < n \leq \frac{L}{K},$$

L is the length of the code block, K is the number of sections;
   a summation unit configured to calculate $$S_a(i) = \sum_{k=0}^{K-1} m_{\frac{kL}{K}+I_a(i)} c\left(x^{\frac{(K-k-1)L}{K}}\right) \text{ and } S_b(i) = \sum_{k=0}^{K-1} m_{\frac{kL}{K}+I_b(i)} c\left(x^{\frac{(K-k-1)L}{K}}\right),$$

where $$m_{\frac{kL}{K}+I_a(i)} \text{ and } m_{\frac{kL}{K}+I_b(i)}$$

are two one-bit data output from a decoder k in a clock cycle i, $$0 \leq i < \frac{L}{2K},$$

$0 \leq k < K$;
   a multiplication unit configured to perform a modular multiplication operation on two polynomials;
   an addition unit configured to perform an addition operation on two polynomials;
   a first arithmetic control unit configured to invoke the basic unit to calculate $$c\left(x^{\frac{(K-k-1)L}{K}}\right)$$

when k=K−2 and invoke the multiplication unit to calculate $$c\left(x^{\frac{(K-k-1)L}{K}}\right)$$

when k≤K−3; and
   a second arithmetic control unit to invoke the basic unit to calculate $$c(x^{\frac{L}{K}-I_a(i)-1}) \text{ and } c(x^{\frac{L}{K}-I_b(i)-1}),$$

invoke the summation unit to calculate $s_a(i)$ and $s_b(i)$, invoke the multiplication unit to calculate $$\tilde{c}_a(i) = c\left(c(x^{\frac{L}{K}-I_a(i)-1})s_a(i)\right) \text{ and } \tilde{c}_b(i) = c\left(c(x^{\frac{L}{K}-I_b(i)-1})s_b(i)\right),$$

and invoke the addition unit to calculate the computation result $\tilde{c}(i)=\tilde{c}_a(i)+\tilde{c}_b(i)$.

11. The apparatus for decoding according to claim 8, further comprising:
a sorting memory unit configured to store the data output from the first component decoding unit or the second component decoding unit, where the data are sorted; and
a second output unit for outputting decoded data configured to read and output the sorted data from the sorting memory unit after the check is determined to be passed according to the check result.

12. The apparatus for decoding according to claim 11, wherein the second output unit for outputting decoded data is further configured to read and output the sorted data from the sorting memory unit when the check is determined to be failed according to the check result and the number of iteration times reaches a maximum value.

13. The apparatus for decoding according to claim 8, wherein the first component decoding unit and the second component decoding unit share the K decoders.

14. A method for checking decoded data, comprising:
performing a check computation on decoded bits output, in one clock cycle, from a plurality of decoders to obtain a computation result, where the decoded bits are divided into a plurality of code sections respectively corresponding to the plurality of decoders, and the code sections have the same offset configuration for the decoded bits contained therein, where the check computation comprises: denoting each decoded bit into a polynomial, computing a sum of the polynomials and performing polynomial modular arithmetic on the sum; and
outputting a check result, where the check result is a sum of the computation results in all the clock cycles during the decoding process.

15. The method for checking decoded data according to claim 14, wherein the computation result is obtained based on the following formula:

$$\tilde{c}(i) = c\left(\sum_{k=0}^{K-1}\left(m_{\frac{kL}{K}+I_a(i)}x^{L-\frac{kL}{K}-I_a(i)-1} + m_{\frac{kL}{K}+I_b(i)}x^{L-\frac{kL}{K}-I_b(i)-1}\right)\right)$$

$$= c\left(\sum_{k=0}^{K-1} m_{\frac{kL}{K}+I_a(i)}x^{L-\frac{kL}{K}-I_a(i)-1}\right) + c\left(\sum_{k=0}^{K-1} m_{\frac{kL}{K}+I_b(i)}x^{L-\frac{kL}{K}-I_b(i)-1}\right),$$

where $\tilde{c}(i)$ is the computation result, $m_{\frac{kL}{K}+I_a(i)}$ and $m_{\frac{kL}{K}+I_b(i)}$ are two one-bit data output from a decoder k in a clock cycle i, respectively, $$0 \le i < \frac{L}{2K},$$

$0 \le k < K$, L is the length of a code block, K is the number of sections, $I_a(i)$ is an offset of the data $m_{\frac{kL}{K}+I_a(i)}$ in a section of the code block and $I_b(i)$ is an offset of the data $m_{\frac{kL}{K}+I_b(i)}$ in a section of the code block.

16. The method for checking decoded data according to claim 14, wherein the check computation comprises:
invoking a basic unit to calculate $$c(x^{\frac{(K-k-1)L}{K}})$$

for k=K−2 and invoking a multiplication unit to calculate $$c(x^{\frac{(K-k-1)L}{K}})$$

for k≤K−3; and
invoking the basic unit to calculate $$c(x^{\frac{L}{K}-I_a(i)-1}) \text{ and } c(x^{\frac{L}{K}-I_b(i)-1}),$$

invoking a summation unit to calculate $s_a(i)$ and $s_b(i)$, invoking the multiplication unit to calculate $$\tilde{c}_a(i) = c\big(c(x^{\frac{L}{K}-I_a(i)-1})s_a(i)\big) \text{ and } \tilde{c}_b(i) = c\big(c(x^{\frac{L}{K}-I_b(i)-1})s_b(i)\big),$$

and invoking an addition unit to calculate the computation result $\tilde{c}(i)=\tilde{c}_a(i)+\tilde{c}_b(i)$;
where the basic unit is configured to calculate $c(x^n)$, where $$0 < n \le \frac{L}{K},$$

L is the length of the code block, K is the number of sections;
where the summation unit is configured to calculate $$s_a(i) = \sum_{k=0}^{K-1} m_{\frac{kL}{K}+I_a(i)} c(x^{\frac{(K-k-1)L}{K}}) \text{ and } s_b(i) = \sum_{k=0}^{K-1} m_{\frac{kL}{K}+I_b(i)} c(x^{\frac{(K-k-1)L}{K}}),$$

where $m_{\frac{kL}{K}+I_a(i)}$ and $m_{\frac{kL}{K}+I_b(i)}$ are two one-bit data output from the decoder k in the clock cycle i, respectively, $$0 \le i < \frac{L}{2K},$$

0≤k<K;
where the multiplication unit is configured to perform a modular multiplication on two polynomials; and
where the addition unit is configured to perform an addition operation on two polynomials.

17. The method for checking decoded data according to claim 16, wherein outputting the check result comprises:
invoking the addition unit to output the check result.

18. The method for checking decoded data according to claim 16, wherein the calculation of $c(x^n)$ comprises:

obtaining $c(x^{pw})$ by looking up a table with p as an index, where $n=pw+q$, w is a power of 2, and $0 \leq q < w$; and calculating $c(x^{pw} x^q)$.

19. The method for checking decoded data according to claim 14, further comprising:

reading the data output from the decoder.

20. The method for checking decoded data according to claim 14, further comprising:

outputting a control signal to terminate decoding after the check is determined to be passed according to the check result.

* * * * *